United States Patent
Kodama et al.

(10) Patent No.: US 6,234,651 B1
(45) Date of Patent: May 22, 2001

(54) TOUCH SENSITIVE SWITCH WITH LIGHT

(75) Inventors: Tomoaki Kodama; Kazuyoshi Hibiya, both of Kanagawa-Ken (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 09/365,853

(22) Filed: Aug. 3, 1999

(30) Foreign Application Priority Data

Aug. 4, 1998 (JP) ................................ 10-220857

(51) Int. Cl.[7] ............................................ F21V 23/00
(52) U.S. Cl. ............................ 362/276; 362/95; 362/489; 362/802
(58) Field of Search .......................... 362/95, 464, 489, 362/276, 802; 200/314, 317

(56) References Cited

U.S. PATENT DOCUMENTS

| | | | |
|---|---|---|---|
| 4,216,524 | * 8/1980 | Leveraus | 362/276 |
| 4,433,328 | * 2/1984 | Saphir et al. | 362/802 |
| 4,868,384 | * 9/1989 | Franken et al. | 362/95 |
| 4,904,991 | * 2/1990 | Jones | 362/464 |
| 5,434,378 | * 7/1995 | McLean | 362/802 |
| 5,442,527 | * 8/1995 | Wichelt | 362/802 |
| 5,808,606 | 9/1998 | Kodama et al. | 345/175 |
| 5,814,945 | * 9/1998 | Hsu | 362/276 |

FOREIGN PATENT DOCUMENTS

| | | |
|---|---|---|
| 4-51403 | 12/1992 | (JP) . |
| 4-51404 | 12/1992 | (JP) . |

\* cited by examiner

*Primary Examiner*—Sandra O'Shea
*Assistant Examiner*—Peggy C Neils
(74) *Attorney, Agent, or Firm*—Morgan, Lewis & Bockius LLP

(57) ABSTRACT

A touch sensitive switch with a light comprises a light sensor which detects a finger approaching the key top using the output of the light sensor to detect that the touch sensitive switch with a light is to be operated before the operation takes place. Notification to the person who operates the key-top can therefore be given by any predetermined effect such as a voice accruing based on the output of the light sensor just before the operation starts. Therefore, confusion does not arise even when the switch is put to a large number of uses.

7 Claims, 1 Drawing Sheet

PRIOR ART

TOUCH SENSITIVE SWITCH WITH LIGHT

This invention claims the benefit of Japanese Patent Application No. 10-220857, filed Aug. 4, 1998, which is hereby incorporated by reference.

BACKGROUND OF THE INVENTION

1. Field of the Invention

The present invention relates to a touch sensitive switch with a light for adoption in operating switches used in vehicle mounted equipment such as audio equipment or air conditioning equipment etc. that is also usable in a dark environment such as during night time.

2. Discussion of the Related Art

An example configuration of a related touch sensitive switch 90 with a light is shown in FIG. 3. In FIG. 3, a switch element 92 and a light-emitting element 93 such as an LED etc. are mounted on a substrate 94 provided within a key top 91 provided at the surface of a panel 20. The switch element 92 is turned on or off by pressing the key top 91.

In this example, the light-emitting element 93 is connected to a day/night switchover circuit (not shown in the drawings) and remains turned off during the day with a display printed on the surface of the key top 91 being read using external light such as daylight. The light-emitting element 93 is then turned on at night, and the display is read using light from the light-emitting element 93.

The related touch sensitive switch 90 has the following problems. First, printing on the surface of the key top 91 is the only indication of the function of the touch sensitive switch 90 of the related configuration. It is therefore inclined for a person to become confused as to which channel is being received when pressing the key top 91 in order to change channel. Second, when this kind of touch sensitive switch 90 is adopted for the above use, touch sensitive switches 90 with channel numbers printed on the surface of the key top 91 have to be used in accordance with the number of channels, so that the apparatus therefore becomes bulky and costs are also increased.

SUMMARY OF THE INVENTION

In order to resolve the aforementioned problems with the related art, in the present invention there is provided a touch sensitive switch with a light. This touch sensitive switch with a light has a switch element and a light emitting element provided within a key top. A surface of the key top is illuminated by light coming from the light emitting element and transmitted by the surface of the key-top. The touch sensitive switch with a light comprises a light sensor. The light sensor is disposed for detecting a finger approaching the key top before start of operation of the switch element.

In the present invention described above, a touch sensitive switch with a light is provided with a light sensor housed in a key top and for detecting a finger approaching the key top. The output of the light sensor is used to detect that the touch sensitive switch is to be operated before the operation takes place. Notification to the person who operates the key-top can therefore be given by any predetermined effect such as a voice sounded based on the output of the light sensor just before the operation starts. There is therefore not the confusion that arises when a plurality of functions are incorporated, and equipment adopting this type of touch sensitive switch can be made smaller and give better results.

As this advance notification is possible, an operator can, for example, be given warnings with respect to the operation of switches etc. that have a substantial effect on operation before such an operation is carried out so that erroneous operation can be prevented and safety can be improved.

According to the present invention, light from the light emitting element conventionally used for lighting the key top is utilized, so that advance notification is carried out with only one additional part, i.e. one light sensor. Costs therefore do not increase significantly and the present invention can be easily realized.

DETAILED DESCRIPTION OF THE PREFERRED EMBODIMENTS

Figure 1:
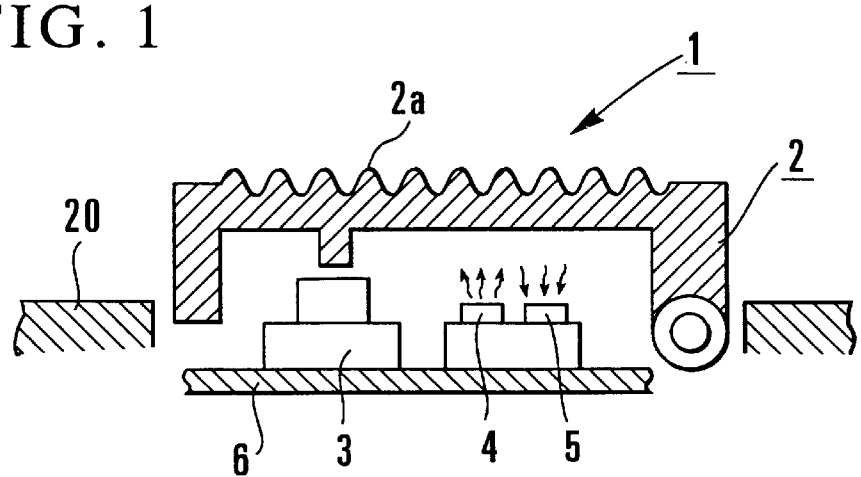
FIG. 1 is a cross-section showing an embodiment of a touch sensitive switch with a light of the present invention.

The following is a detailed description of the present invention based on the embodiments shown in the drawings. Whenever possible, the same reference numbers will be used throughout the drawings to refer to the same or like parts.

In FIG. 1, numeral 1 indicates a touch sensitive switch with a light of the present invention (hereinafter referred to as "touch sensitive switch 1") provided with a switch element 3 and a light emitting element 4 within a key top 2. The surface of the key top 2 is illuminated by the light emitting element 4 as in the related example. Switching on and off of the light emitting element 4 in response to peripheral brightness during the day and night is also the same as in the related example.

In the present invention, a light sensor 5 is provided within the key top 2. This light sensor 5 can be, for example, a photo-diode etc., or can be separate from the light emitting element 4, or alternatively can be the light emitting/receiving element shown in FIG. 1 where the light emitting element 4 and the light sensor 5 are integrally formed as a single unit. In FIG. 1, the switch element 3, the light emitting element 4, and the light sensor 5 etc. are mounted on a substrate 6, and the touch sensitive switch 1 is attached to a panel 20.

It is ensured that the light sensor 5 does not generate an output of greater than a sensing level even when the light emitting element 4 is lit, since the light-emitting angle of the light emitting element 4 and the light receiving angle of the light sensor 5 and the transparency of the key top 2 are optimized.

When the key top 2 of the touch sensitive switch 1 of the above configuration is pressed by a person's finger etc., the switch element 3 responds and a contact between the key-top 2 and the switch element 3 is closed or opened. A signal resulting from the making or breaking of this contact is transmitted to a control circuit on the side of the apparatus at which the touch sensitive switch 1 is provided. A desired operation such as changing the channel on a television is then carried out at the apparatus to which the touch sensitive switch 1 is attached.

The operation of the light sensor 5 of the present invention will now be described. The approaching of a finger etc. towards the key top 2 in order to operate the key top 2 is detected as an output occurring due to light which comes from the light emitting element 4, passes through the key top 2, and is reflected by the finger etc., then once more be transmitted through the key top 2 and reach the light sensor 5.

The timing of the operation of the switch element 3 and the light sensor 5 is such that detection of the proximity of a finger etc. by the light sensor 5 is carried out when or before the key top 2 is touched. Detection by the light sensor 5 is therefore carried out prior to the operation start of the switch element 3.

Next, the operation of the touch sensitive switch 1 which is used in bright surroundings with the light emitting element 4 turned off will be described. In this case there is always an output at the light sensor 5 because external light is transmitted thereto through the key top 2. When a finger etc. is then brought close to the key top 2 in order to operate the touch sensitive switch 1, the external light is blocked out by the finger etc. and an output is not generated from the light sensor 5 so that the approach of a finger etc. is detected. Detection of the proximity of the finger is also carried out before operation start of the switch element 3 in this case.

Figure 2:
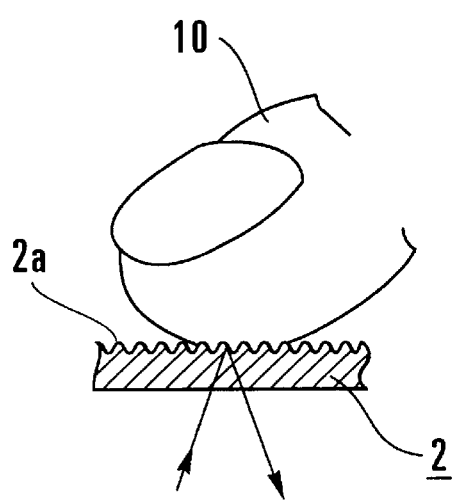
FIG. 2 is a cross-section of the important parts of a further embodiment of a touch sensitive switch with a light of the present invention.
Figure 3:
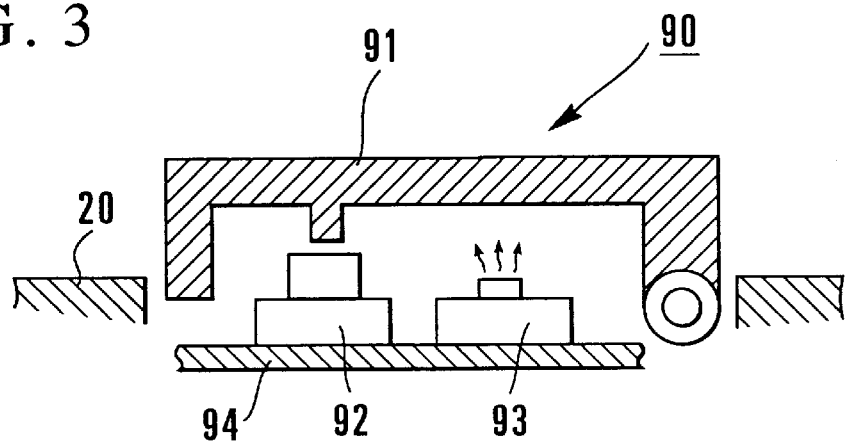
FIG. 3 is a cross-section showing a related example.

FIG. 2 illustrates a preferred configuration for the key top 2 when the light sensor 5 is provided. Experimentation and research carried out by the inventor in bringing about the present invention showed that far more preferable results were obtained when a finely roughened surface such as a so-called knurled finish 2a is provided at the surface of the key top 2 to be touched by a finger etc.

According to the present invention, operation of the touch sensitive switch 1 can be predicted from the detection given by the output of the light sensor 5 before the touch sensitive switch 1 is operated. The operator can therefore be notified beforehand by, for example, voice etc., of the operation that is to occur when the touch sensitive switch 1 is operated.

A user can therefore be made aware of a channel name etc. when tuning in stations of, for example, a television or a radio etc. by operating the touch sensitive switch 1 and it is no longer necessary to provide the touch sensitive switches 1 in accordance with the number of channels. It is also possible to output audio or display pictures etc. for warning with a personal computer etc. when, for example, pressing a delete key etc. which will have a particularly significant results.

The functions required of the key top 2 with the foregoing configuration are as follows. First, the display printed on the key top 2 needs to be clearly readable. Second, the light sensor 5 needs to be highly sensitive to light from the light emitting element 4 that passes through the key top 2 and is reflected by a finger 10 etc. Third, external light needs to be reliably blocked by a finger etc.

It is conceivable for the key top 2 to be finished in the following ways: a) front and rear are not processed; b) the knurled finish 2a is formed in the front surface of the key top 2 that the finger 10 comes into contact with; c) the knurled finish 2a is formed on the rear surface of the key top 2; d) the knurled finish 2a is formed on both sides of the key top 2. However, when neither sides of the key top 2 are processed, detection of reflected light by the light sensor 5 and the detection of external light were superior but the display could not be read in a sufficiently clear manner.

When both sides are processed, the surface enables the display to be read in a clear manner but the light sensor 5 is rather less sensitive to reflected light and external light. When the rear surface is processed, the readability of the display is acceptable but detection sensitivity of the light sensor 5 to light reflected by the finger 10 and returned thereto is reduced.

When the knurled finish 2a is applied to the front surface to be touched by the finger 10, the finger 10 and the knurled finish 2a touch each other closely. Air therefore does not exist between the finger 10 and the knurled finish 2a. Accordingly, the knurled finish 2a does not diffuse the light. Light reflected by the finger 10 therefore reaches the light sensor 5 in an efficient manner and detection sensitivity is improved.

According to the present invention, operation of the touch sensitive switch 1 can be predicted from the detection given by the output of the light sensor 5 before the touch sensitive switch 1 is actually operated. The operator can therefore be notified beforehand by, for example, voice etc., of the operation that is to occur when the touch sensitive switch 1 is operated.

In the present invention described above, a touch sensitive switch with a light is provided with a light sensor housed in a key top and for detecting a finger approaching the key top. The output of the light sensor is used to detect that the touch sensitive switch is to be operated before the operation takes place. Notification to the person who operates the key-top can therefore be given by any predetermined effect such as a voice sounded based on the output of the light sensor just before the operation starts. There is therefore not the confusion that arises when a plurality of functions are incorporated, and equipment adopting this type of touch sensitive switch can be made smaller and give better results.

As this advance notification is possible, an operator can, for example, be given warnings with respect to the operation of switches etc. that have a substantial effect on operation before such an operation is carried out so that erroneous operation can be prevented and safety can be improved.

According to the present invention, light from the light emitting element conventionally used for lighting the key top is utilized, so that advance notification is carried out with only one additional part, i.e. one light sensor. Costs therefore do not increase significantly and the present invention can be easily realized.

It will be apparent to those skilled in the art that various changes and modifications can be made to the disclosed invention without departing from the spirit and scope of thereof. Thus, it is intended that the invention cover the modifications and variations of this invention provided they come within the scope of the appended claims and their equivalents.

What is claimed is:

1. A touch sensitive switch with a light, comprising:
   a switch element for controlling the operation of a device connected to the switch element;
   a key top located adjacent the switch element;
   a light emitting element provided within the key top and with a surface of the key top being illuminated by light transmitted by the light emitting element; and
   a light sensor for detecting a finger approaching the key top before operation of the switch element to indicate the device to be operated by the switch element.

2. The touch sensitive switch of claim 1, wherein detection of the approach of the finger is carried out using light from the illuminated light emitting element reflected by the finger.

3. The touch sensitive switch of claim 1, wherein detection of the approach of the finger is carried out using blocking out of external light by the finger when the light emitting element remains extinguished.

4. The touch sensitive switch of claim 2, wherein detection of the approach of the finger is carried out using blocking out of external light by the finger when the light emitting element remains extinguished.

5. The touch sensitive switch of claim 1, wherein a front surface of the key top undergoes fine roughing processing in order to bring about light diffusion.

6. The touch sensitive switch of claim 2, wherein a front surface of the key top undergoes fine roughing processing in order to bring about light diffusion.

7. The touch sensitive switch of claim 3, wherein a front surface of the key top undergoes fine roughing processing in order to bring about light diffusion.

* * * * *